(12) United States Patent
Nishiura et al.

(10) Patent No.: US 7,432,186 B2
(45) Date of Patent: *Oct. 7, 2008

(54) METHOD OF SURFACE TREATING SUBSTRATES AND METHOD OF MANUFACTURING III-V COMPOUND SEMICONDUCTORS

(75) Inventors: Takayuki Nishiura, Itami (JP); Tomoki Uemura, Itami (JP)

(73) Assignee: Sumitomo Electric Industries, Ltd, Osaka (JP)

( * ) Notice: Subject to any disclaimer, the term of this patent is extended or adjusted under 35 U.S.C. 154(b) by 118 days.

This patent is subject to a terminal disclaimer.

(21) Appl. No.: 11/425,394

(22) Filed: Jun. 21, 2006

(65) Prior Publication Data

US 2007/0014915 A1    Jan. 18, 2007

(30) Foreign Application Priority Data

Jun. 22, 2005    (JP)    ............... 2005-182217

(51) Int. Cl.
*H01L 21/3205*    (2006.01)
(52) U.S. Cl. .................. 438/604; 438/690; 438/906; 257/E21.697
(58) Field of Classification Search .......... 438/572, 438/603; 257/E21.213, E21.217
See application file for complete search history.

(56) References Cited

U.S. PATENT DOCUMENTS 5,763,016 A * 6/1998 Levenson et al. ........... 427/510

2005/0023552 A1 * 2/2005 Chang et al. ................ 257/103
2005/0081885 A1 * 4/2005 Zhang et al. .................. 134/2

FOREIGN PATENT DOCUMENTS

| EP | 0617458 A2 | 9/1994 |
| EP | 1530232 A2 | 5/2005 |
| JP | S62-252140 A | 11/1987 |
| JP | 2001-044169 A | 2/2001 |
| JP | 2001-189278 A | 7/2001 |

OTHER PUBLICATIONS

A. Guivarc' H, et al. "Chemical Cleaning of InP Surfaces: Oxide Composition and Electrical Properties," Journal of Applied Physics, Feb. 1984, pp. 1139-1148, vol. 55, No. 4, American Institute of Physics, NY.
J. Olivier, et al. "Chemical Cleaning Procedures of GaAs (100) Surfaces Studied by X-ray Photoelectron Spectroscopy," Sep. 24, 1990, pp. 305-310, vol. Symp. 17. Gallium Arsenide and Related Compounds, Sep. 24-27, 1990, Institute of Physics, Bristol, Philadelphia and New York.

(Continued)

*Primary Examiner*—Scott B. Geyer
*Assistant Examiner*—Cheung Lee
(74) *Attorney, Agent, or Firm*—James W. Judge

(57) ABSTRACT

Affords methods of surface treating a substrate and of manufacturing Group III-V compound semiconductors, in which a substrate made of a Group III-V semiconductor compound is rendered stoichiometric, and microscopic roughness on the surface following epitaxial growth is reduced. The methods include preparing a substrate made of a Group III-V semiconductor compound (S10), and cleaning the substrate with a cleaning solution whose pH has been adjusted to an acidity of 2 to 6.3 inclusive, and to which an oxidizing agent has been added (S20).

7 Claims, 3 Drawing Sheets

OTHER PUBLICATIONS

Y. Sun, et al. "Optimized Cleaning Method for Producing Device Quality InP(100) Surfaces," Journal of Applied Physics 97, 124902 (2005), pp. 124902-1 through 124902-7, American Institute of Physics, NY.

Y. Tao, et al. "S-passivated Inp(100)-(1X1) Surface Prepared by a Wet Chemical Process," Appl. Phys. Lett. 60 (21), May 25, 1992, pp. 2669-2671, American Institute of Physics, NY.

* cited by examiner

METHOD OF SURFACE TREATING SUBSTRATES AND METHOD OF MANUFACTURING III-V COMPOUND SEMICONDUCTORS

BACKGROUND OF THE INVENTION

1 Technical Field

The present invention relates to methods of surface treating substrates and to methods of manufacturing (Group) III-V compound semiconductors; in particular the invention relates to substrate surface treating and III-V compound semiconductor manufacturing methods that enable the reduction of post-epitaxial-growth surface roughness.

2 Description of the Related Art

Substrates composed of Group III-V semiconductor compounds have been widely used for semiconductor lasers, LEDs, and high-speed devices because they have luminescent properties and high electron mobility. Surface treatment is typically carried out in methods of manufacturing substrates composed of Group III-V semiconductor compounds. Such surface treatments include, for example, the surface treatment method disclosed in Japanese Unexamined Pat. App. Pub. No. 2001-189278, and the method of cleaning an InP wafer disclosed in Japanese Unexamined Pat. App. Pub. No. S62-252140.

In the surface treatment method disclosed in Japanese Unexamined Pat. App. Pub. No. 2001-189278, the front side of GaAs as a compound semiconductor is surface treated with ozonated water prior to epitaxial growth in order to reduce Si or silicon compounds on the surface.

In the InP wafer cleaning method disclosed in Japanese Unexamined Pat. App. Pub. No. S62-252140, the surface of InP is treated with a liquid mixture of phosphoric acid-hydrogen peroxide-water or a liquid mixture of hydrogen fluoride-hydrogen peroxide-water.

However, if the typical surface treatment method by an ozonated water process disclosed in Pat. App. Pub. No. 2001-189278 is applied to InP, the surface roughness of InP does not decrease. The reason is as follows. Ozonated water typically exhibits neutrality. If the surface treatment is performed with neutral ozonated water, the surface becomes Group III-rich because the stoichiometry (stoichiometric composition) of the surface of Group III-V is not optimum. As a result, in epitaxial growth the surface is likely to become roughened because Group III oxide hinders epitaxial growth.

In the surface treatment of the front side of GaAs with ozonated water disclosed in Japanese Unexamined Pat. App. Pub. No. 2001-189278, microscopic roughness (haze) in the surface after epitaxial growth is larger than before epitaxial growth. The reason is as follows. Ga generates a dense oxide because Ga has a tendency to oxidize readily with ozonated water. With the generation of a dense oxide on the Ga surface, it is likely to become roughened when an epitaxial film is grown on the surface, because the oxide hinders the epitaxial growth.

In the method of cleaning the surface of InP wafer with a liquid mixture of phosphoric acid-hydrogen peroxide-water or a liquid mixture of hydrogen fluoride-hydrogen peroxide-water disclosed in Japanese Unexamined Pat. App. Pub. No. S62-252140, microscopic roughness of the surface increases following epitaxial growth. The reason is as follows. The acid based treatment liquid used in Japanese Unexamined Pat. App. Pub. No. S62-252140 makes the acid concentration too high (the pH too low). Consequently, dense Group V oxide is generated on the surface and hinders epitaxial growth. This causes haze on the InP surface following epitaxial growth to increase. The overly high concentration of the aqueous hydrogen peroxide leads to intense localized reactions arising due to the unevenness of the oxide on the surface or to foreign matter that clings to the surface, as a consequence of which minute surface irregularities can arise. Meanwhile, neutral or alkaline treatment solutions cannot eliminate Group III oxide generated on the original surface, such that remaining Group III oxide hinders epitaxial growth, and microscopic roughness on the surface further increases. The microscopic surface roughness hinders electrons from moving through the high-purity channel layer in a high-speed device such as an HEMT and consequently compromises the device's electrical properties.

BRIEF SUMMARY OF THE INVENTION

An object of the present invention, in view of the circumstances noted above, is to make available a method of surface treating substrates and a method of manufacturing Group III-V compound semiconductors, in which the substrate composed of a Group III-V semiconductor compound is rendered stoichiometric and the microscopic roughness on the surface after the epitaxial growth is reduced.

The present invention is a method of surface treating a substrate, comprising a step of preparing a substrate comprising Group III-V semiconductor compound; and a step of cleaning the substrate with a cleaning solution whose pH has been adjusted to be acidic from 2 to 6.3 inclusive and to which an oxidizing agent has been added.

Since pH is adjusted to be from 2 to 6.3 inclusive, the surface of the substrate can be stoichiometric, thereby reducing haze on the surface of the substrate. Additionally, the cleaning solution is deionized water ("DI water" hereinafter) to which an oxidizing agent is added, which contributes to improving the cleaning performance.

In the substrate surface treating method involving the invention in another aspect, it is preferable that in the substrate preparation step the substrate prepared contain 5 mass % or more of indium.

Accordingly, in the method of surface treating a substrate comprising a Group III-V semiconductor compound containing indium, the substrate is further stoichiometric to reduce the microscopic roughness on the surface.

In a substrate surface treating method involving the invention in a further aspect, it is preferable that the cleaning time in the cleaning step is from 5 seconds to 60 seconds inclusive.

Accordingly, even if the process is performed in a short time, the substrate comprising Group III-V compound semiconductor is stoichiometric, thereby reducing the microscopic roughness of the surface. Additionally, since the process can be performed in a short time, the cost of the processing solution can be reduced and the productivity can be improved.

In a substrate surface treating method involving the invention in a further aspect, it is preferable that the method further comprises a pre-cleaning step, in advance of the cleaning step, of cleaning the substrate with an alkaline cleaning solution.

Utilizing an alkaline cleaning solution in a pre-cleaning step thereby allows particles to be removed.

In a substrate surface treating method involving the invention in a further aspect, it is preferable that the pre-cleaning step includes a water-wash substep of rinsing the substrate with DI water.

Since DI water is used for cleaning, the alkaline cleaning solution does not remain behind. As a result, unstable reactions, such as a neutralization reaction, during the acid wash are prevented and the effectiveness of the acid wash is not hindered, thereby shortening the acid wash time.

In a substrate surface treating method involving the invention in a further aspect, it is preferable that the cleaning step includes a substep of rinsing the substrate with DI water.

In a substrate surface treating method involving the invention in a further aspect, it is preferable that the rinsing step includes applying ultrasonic wave to the DI water.

Accordingly, the clinging of particles to the substrate surface can be reduced.

In a further aspect the invention is a method of manufacturing Group III-V compound semiconductor, comprising a step of implementing the above-described substrate surface treating method; and a step of depositing a film on the surface of the substrate after the step of implementing the substrate surface treating method.

Accordingly, a Group III-V compound semiconductor is manufactured in which the substrate surface is stoichiometric and the microscopic roughness of the surface is reduced.

According to the present invention, since pH of the cleaning solution is adjusted to be from 2 to 6.3 inclusive, the surface is stoichiometric, thereby reducing haze on the surface after the epitaxial growth. Additionally, since the cleaning solution is DI water to which an oxidizing agent is added, the cleaning ability can be improved.

From the following detailed description in conjunction with the accompanying drawings, the foregoing and other objects, features, aspects and advantages of the present invention will become readily apparent to those skilled in the art.

DETAILED DESCRIPTION OF THE INVENTION

Figure 1:
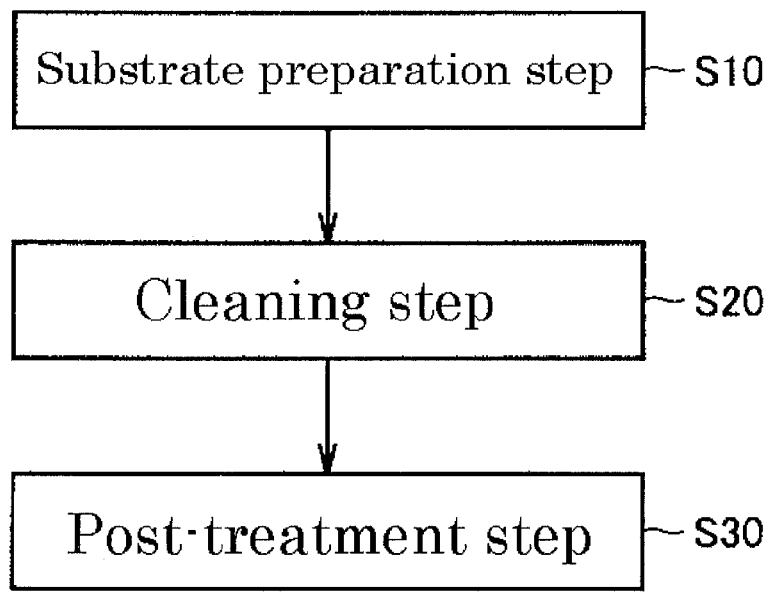
FIG. 1 is a flow chart showing a method of surface treating the substrate in Embodiment 1 of the present invention.

Hereinafter, referring to the figures, embodiments and examples of the present invention will be described. It should be understood that in the drawings accompanying the present description, identical reference marks are meant to indicate either identical or equivalent parts, and their explanation will not repeated.

Embodiment 1

FIG. 1 is a flow chart showing a method of surface treating a substrate in Embodiment 1 of the present invention. Referring to FIG. 1, the substrate surface treating method in Embodiment 1 of the present invention will be described.

As shown in FIG. 1, a substrate preparation step (S10) is performed first in the substrate surface treating method in Embodiment 1, in which a substrate composed of Group III-V compound is prepared. The prepared substrate may be a bulk crystal or a thin film formed on a substrate made of a bulk crystal, for example.

Next, a cleaning step (S20) is performed. In the cleaning step (S20), the substrate is cleaned with a cleaning solution whose pH has been adjusted to be acidic from 2 to 6.3 inclusive and to which an oxidizing agent has been added. It is preferable that as the cleaning solution a cleaning solution composed of DI water (a cleaning solution composed of DI water in which pH has been adjusted to be acidic from 2 to 6.3 inclusive, and an oxidizing agent has been added) is used. The use of the cleaning solution composed of the DI water prevents the surface of the substrate from being contaminated by impurities such as metal.

In the step of adjusting pH of the cleaning solution, preferably, at least one selected from a group consisting of inorganic acid, organic acid, or water-soluble acid gas is contained in the DI water. Preferably, as the organic acid, formic acid, acetic acid, oxalic acid, lactic acid, malic acid, and citric acid are used. The reason is that it is easy to adjust pH of the cleaning solution to be about four because the organic acids are slightly acidic. It is preferable that as the water-soluble acid gases, for example, carbonic acid gas, hydrochloric gas (HCl), or hydrogen fluoride gas (HF) are used.

As the oxidizing agents, hydrogen peroxide water is used, for example. The concentration of the oxidizing agent is in the range between 5 ppm and 1 mass %, for example, more preferably, between 10 ppm and 0.5 mass %. The reason is that if the concentration of oxidizing agent is under 5 ppm, the cleaning ability decreases, and if the concentration of the oxidizing agent is above 1 mass %, the oxidizing agent may react with an oxide, an organic material, or particles on the surface, thereby locally generating irregularities on the surface.

Preferably, the cleaning time is, being not particularly restricted, in the range between five seconds to sixty seconds. The reason is that if the process is performed in a short time, the cleaning solution cost is reduced and the productivity is improved.

The temperature of the cleaning solution is, being not particularly restricted, set to be room temperature. The reason is that equipment that surface treats a substrate is simplified by setting the temperature to be room temperature.

Next, a post-treatment step (S30) is performed in which a deposition step (epitaxial growth) is performed on the substrate after the cleaning step (S20). In the post-treatment step (S30), the deposition step is performed in which a certain film is formed on a surface of the substrate composed of Group III-V compound semiconductor. It is preferable that a plurality of devices are formed on the substrate, in which the substrate would be divided into a plurality of devices by performing a dividing step, e.g., dicing such that a certain configuration is formed on the substrate surface and then the substrate is divided into individual elements. Accordingly, a device composed of Group III-V compound semiconductor is obtained. The device can be mounted on a lead frame, for example. Then, by performing a wire bonding step, a semiconductor device having the element is obtained.

There are no particular restrictions on conditions of the substrate only if the substrate is composed of Group III-V compound semiconductor. It is preferable that the substrate includes 5 mass % or more of indium (In). For example, a compound semiconductor such as InP, InAs, InSb, and InN can be used. The reason is that if the substrate composed of these Group III-V compound semiconductors is surface treated with the substrate surface treating method in Embodiment 1, In oxide, which is difficult to be removed, is dissolved to make the surface more stoichiometric and decrease haze on the surface. In other words, the cleaning ability is improved.

As described above, the substrate surface treating method in Embodiment 1 of the present invention includes the step (S10) of preparing a substrate composed of Group III-V compound semiconductor, and the cleaning step (S20) of cleaning the substrate with a cleaning solution whose pH has been adjusted to be from 2 to 6.3 inclusive and to which an oxidizing agent has been added. Since pH is adjusted to be more acidic, e.g., from 2 to 6.3 inclusive, the substrate surface is rendered stoichiometric. As a result, haze on the substrate after the epitaxial growth is decreased. In addition, since the oxidizing agent is added to the cleaning solution, the cleaning ability is improved.

Embodiment 2

Figure 2:
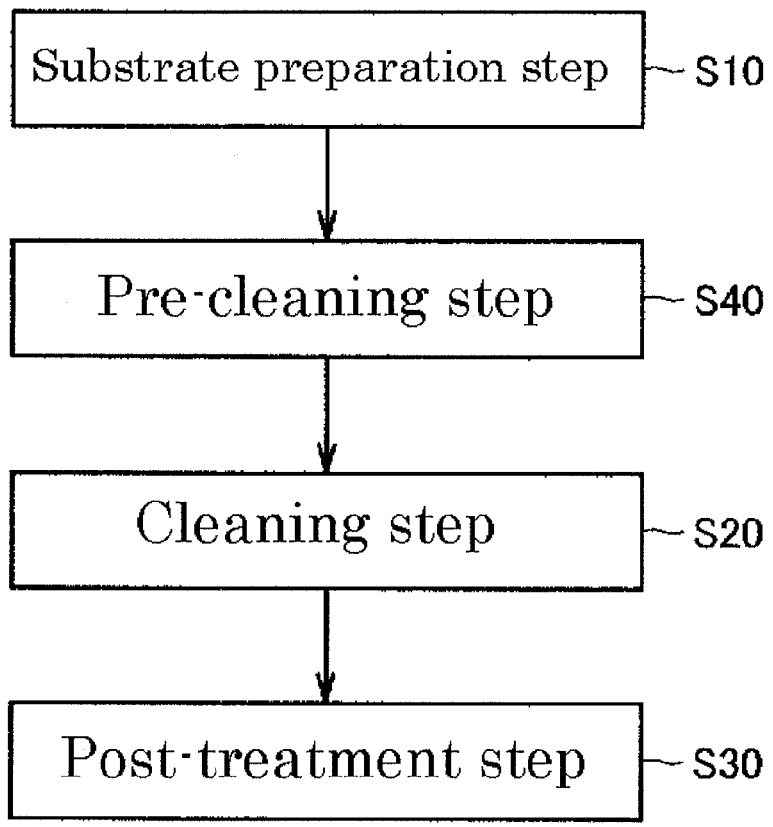
FIG. 2 is a flow chart showing a method of surface treating the substrate in Embodiment 2 of the present invention.

FIG. 2 is a flow chart that shows a substrate surface treating method in Embodiment 2 of the present invention. Referring to FIG. 2, the substrate surface treating method in Embodiment 2 of the present invention will be described.

As shown in FIG. 2, the substrate surface treating method (cleaning method) in Embodiment 2 has basically steps similar to those of the substrate surface treating method in Embodiment 1 of the present invention.

More specifically, in a pre-cleaning step (S40), before the cleaning step (S20), the substrate is cleaned with an alkaline cleaning solution. The pre-cleaning step (S40) may include a chemical cleaning step, a rinsing step (DI water rinsing step), and a drying step. The chemical cleaning step and the rinsing step (DI water rinsing step) can be repeated several times, if necessary.

In the pre-cleaning step (S40), in order to remove impurities from the surface of the substrate composed of Group III-V compound semiconductor, any suitable manner can be used. For example, in the pre-cleaning step (S40), an alkaline cleaning solution is used. It is preferable that one is selected, as an alkaline cleaning solution, from a group consisting of aqueous sodium hydroxide (NaOH), aqueous potassium hydroxide (KOH), aqueous ammonia, and a cleaning solution including amines. The reason is that the alkaline cleaning solutions are effective in removing particles on the surface.

As described above, the substrate surface treating method in Embodiment 2 of the present invention includes the pre-cleaning step (S40) before the cleaning step (S20), in which the substrate is cleaned with the alkaline cleaning solution. The pre-cleaning step (S40) may include a rinsing step (DI water rinsing step) to clean the substrate with the DI water. As a result, in the pre-cleaning step (S40), particles can be removed with the alkaline cleaning solution. In the rinsing step, even if the alkaline cleaning solution is used in the pre-cleaning, haze on the surface of the substrate after the epitaxial growth is reduced because cleaning with the DI water does not leave the alkaline cleaning solution.

Embodiment 3

Referring to FIG. 2, a substrate surface treating method in Embodiment 3 of the present invention will be described. As shown in FIG. 2, the substrate surface treating method (cleaning method) in Embodiment 3 has basically steps similar to those of the substrate surface treating method in Embodiment 2 of the present invention.

Specifically, the cleaning step (S20) includes a rinse step of cleaning the substrate with DI water to which ultrasonic wave is being applied. In the rinse step, vibrations or shaking is applied to the cleaning solution using a ultrasonic device, as shown in FIG. 3, for example.

More specifically, the cleaning step (S20) may include a chemical cleaning step, a rinse step, and a drying step. The chemical cleaning step and the rinse step can be repeated several times, if required.

Figure 3:
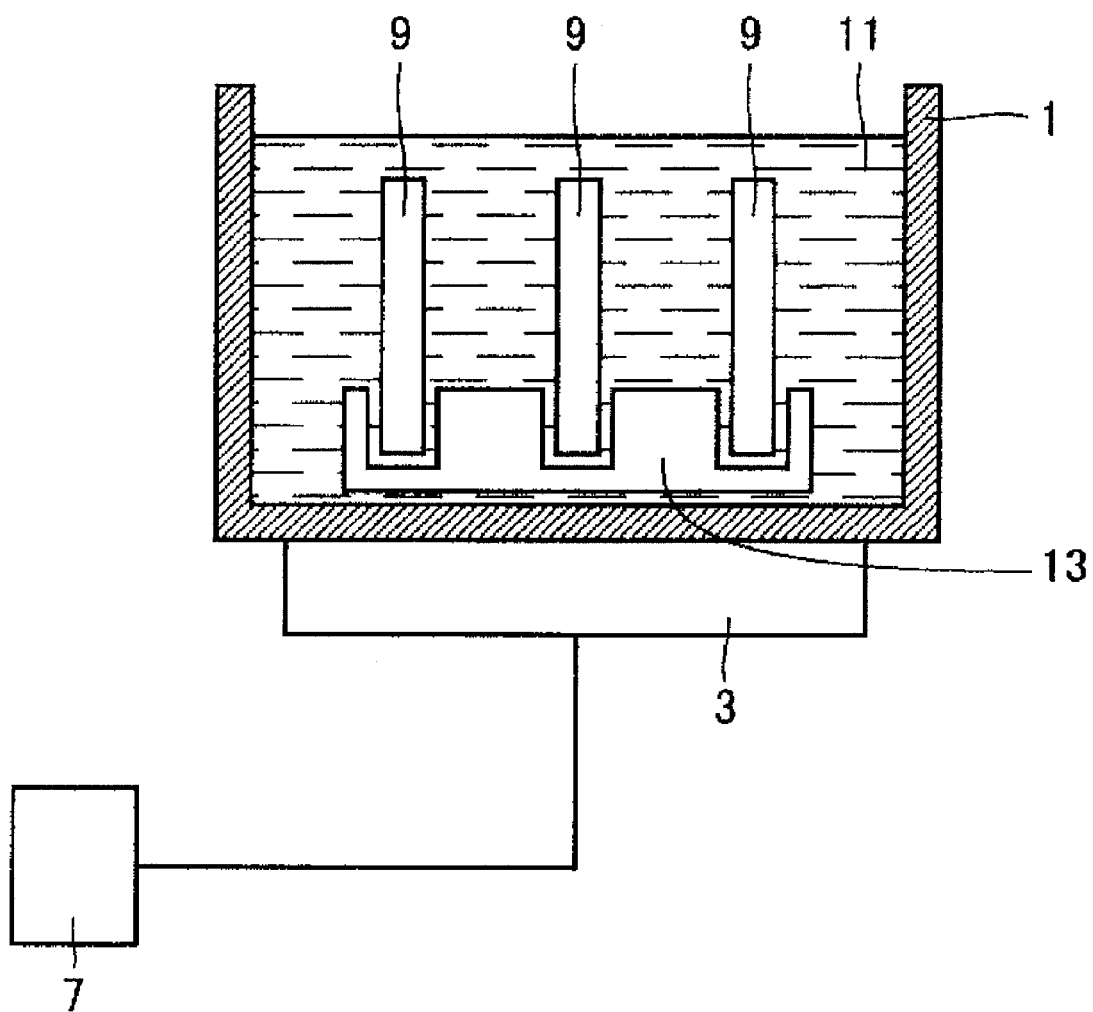
FIG. 3 is a schematic cross section of a cleaning apparatus used in a rinse step.

FIG. 3 is a schematic cross sectional view of showing a processing apparatus used for the rinse step. Referring to FIG. 3, the processing apparatus used for the substrate surface treating method according to the present invention will be described.

As shown in FIG. 3, the processing apparatus includes a cleaning bath 1 that contains cleaning solution 11 as rinse, an ultrasonic wave generation device 3 that is disposed on a bottom surface of the cleaning bath 1, and a controller 7 that is connected to the ultrasonic wave generation device 3 to control the ultrasonic wave generation device 3. The cleaning solution 11 is contained in the cleaning bath 1. In addition, a plurality of holders 13 for holding a plurality of substrates 9 is immersed in the cleaning solution 11. The holder 13 holds a plurality of the substrates 9 made of Group III-V compound semiconductor as objects of cleaning. The ultrasonic wave generation device 3 is located on the bottom surface of the cleaning bath 1.

When the substrate is cleaned in the rinse step, the cleaning solution 11 is provided into the cleaning bath 1 as shown in FIG. 3 and the substrates 9 held by the holders 13 are immersed into the cleaning solution 11 together with the holders 13. As described above, the surface of the substrate 9 is cleaned with the cleaning solution 11.

The ultrasonic wave generation device 3 can be controlled in the process by the controller 7 so as to produce ultrasonic wave, which is applied to the cleaning solution 11. Accordingly, the cleaning solution 11 vibrates, thereby increasing the effects of removing impurities or particles from the substrates 9. The cleaning bath 1 may be put on a member that can be shaken, such as an XY stage, and by shaking the member the cleaning bath 1 can be shaken and the cleaning solution 11 inside can be stirred. Alternatively, the substrates 9 may be shaken together with the holder 13 by manual labor to stir the cleaning solution 11. In these cases, it is possible to increase the effect of removing impurities or particles from the substrate 9, likewise as applying the ultrasonic wave.

As described above, in the substrate surface treating method in Embodiment 3 of the present invention, the cleaning step includes the rinse step of cleaning the substrate with DI water, and in the rinse step the ultrasonic wave is applied to the DI water. Although the particles are likely to be attached because the acidic cleaning solution (rinse) is used, by cleaning the substrate with the cleaning solution containing DI water to which the ultrasonic wave is being applied, it is possible to reduce the number of the particles attached to the surface of the substrate. The processing apparatus shown in FIG. 3 can be applied to other cleaning processes.

Implementation Examples

In order to confirm effects of the substrate surface treating method according to the present invention, samples were provided by Implementation Examples 1 through 5 and Comparative Examples 1 through 3, and the microscopic roughness and the number of particles on the sample surfaces were measured before and after the cleaning step. Prepared samples, measuring methods, and measurement results will be described hereinafter.

Preparation of Cleaning Solution

First, a cleaning solution having a pH from 2 to 6.3 inclusive was prepared in order to optimize stoichiometry of the surface of a Group III-V compound semiconductor. Specifically, the following cleaning solutions were prepared by adding pH adjusting agents and oxidizing agents as well. In Implementation Examples 1 through 5 and Comparative Examples 1 through 3, pH adjusting agents and oxidizing agents employed the following materials. The pH value of the cleaning solution was measured by hydrogen-ion concentration measurement equipment, the calibration of which being performed with standard solutions having pH of 6.97 and 4.0.

Manufacturing Samples in Example 1

First, the substrate preparation step (S10) was performed. Specifically, as Group III-V compound semiconductor crystal, Fe-doped InP crystal was used. As InP crystal, InP crystal having a cylindrical shape with an outer diameter 50 mm was prepared. The crystal was wire-saw sliced at a plane orientation of (100)±1°. The substrate was lapped with SiC abrasive powder as hard abrasive, and then the substrate was etched with a liquid using acid and an oxidizing agent such as sulfuric acid, nitric acid, hydrochloric acid, and hydrogen peroxide. After that, one side of the substrate was finished with Br-methanol and polished. In the final polishing, the substrate was affixed to a glass plate with wax purified from turpentine.

Next, the pre-cleaning step (S40) was performed. Specifically, after finishing polishing, alkali cleaning was carried out on the surface, and then the substrate was rinsed and peeled off from the plate. After that, the substrate was cleaned with the organic solvent and the alkali cleaning was carried out.

Next, the cleaning step (S20) was performed. Specifically, ozone gas (concentration 15 ppm to 40 ppm) generated by electrolysis of the DI water as an oxidizing agent and carbonic acid gas as a pH adjusting agent were added to the de-aired DI water so that the liquid would have a pH of 4. In a cleaning bath which provided the ozonated water whose pH had been adjusted, the above-mentioned InP substrate was cleaned for one minute. Then, as a rinse step, with the DI water with 17.5 MΩcm to 18.2 MΩcm to which the ultrasonic wave was not being applied, the substrate was cleaned for three minutes. After that, the substrate was dried in a vapor of isopropyl alcohol. Finally, the post-treatment step (S30) was performed. Specifically, the epitaxial growth was carried out on the substrate by a metal organic CVD system (MOCVD system). In Example 1, an InP film was grown on the Fe-doped InP substrate to be about 2 μm, an InGaAs film was grown to be about 4 μm, and an InP film was grown thereon to be about 1 μm.

Manufacturing Sample in Example 2

First, the substrate preparation step (S10) was performed. Specifically, Fe-doped InP crystal was used as crystal made of Group III-V compound semiconductor. As InP crystal, an InP crystal having a cylindrical shape with an outer diameter of 50 mm was prepared. The crystal was wire-saw sliced at a plane orientation of (100)±1°. The substrate was lapped with $Al_2O_3$ abrasive powder as hard abrasive, and then was etched with Br-methanol liquid. After that, one side of the substrate was polished using acidic colloidal silica and an oxidizing agent.

Next, the pre-cleaning step (S40) was performed. Specifically, after the polishing, the substrate was cleaned with water, and acid and alkali cleaning were carried out. After that, the substrate was dried by a centrifugal drying apparatus.

Next, the cleaning step (S20) was performed. Specifically, hydrochloric acid as a pH adjusting agent was added to hydrogen peroxide water with a dilution of 0.5% diluted with the DI water. In other words, the hydrogen peroxide water and the hydrochloric acid were added to the DI water so that the cleaning solution would have a pH of 2. Then, the wafer was set onto a rotatable stage and was rotated at 500 rpm, while being sprayed with the cleaning solution for eight seconds. Next, as a rinse step, the substrate was rinsed for twenty second with the DI water to which the ultrasonic wave was not being applied, and then the substrate was rotated at 1500 rpm to sputter the moisture for drying.

Then, the post-treatment step (S30) was performed. Since the step (S30) was performed in a manner similar to that in Example 1, the description will not be repeated.

Manufacturing Sample in Example 3

First, the substrate preparation step (S10) was performed. Specifically, Fe-doped InP crystal as crystal made of Group III-V compound semiconductor was used. As InP crystal, InP crystal having a cylindrical shape with an outer diameter of 50 mm was prepared. Then, the crystal was wire-saw sliced at a plane orientation of (100)±1°, and the substrate was lapped by ceria abrasive powder as hard abrasive and then was etched by aqua regia.

After that, one side of the substrate was polished with colloidal silica containing organic acid and a chlorine-based oxidizer.

Next, the pre-cleaning step (S40) was performed. Since the step (S40) was similar to that in Example 2, the description will not be repeated.

Next, the cleaning step (S20) was performed. Specifically, as a cleaning solution, ozonated water having a pH of 6.3 adjusted by the carbonic acid gas was used. Then, the wafer was set onto a rotatable stage and was rotated at 100 rpm, while being sprayed with the cleaning solution for thirty seconds. Next, as a rinse step, the substrate was rinsed for twenty seconds with DI water to which the ultrasonic wave was not being applied, and then the substrate was rotated at 3000 rpm to sputter the moisture for drying. Finally, the post-treatment step (S30) was performed. Since the step (S30) was performed in a manner similar to that in Example 1, the description will not be repeated.

Manufacturing Sample in Example 4

First, the substrate preparation step (S10) was performed. Since the step (S10) was performed in a manner similar to that in Example 1, the description will not be repeated.

Next, the pre-cleaning step (S40) was performed. Since the step (S40) was performed in a manner similar to that in Example 1, the description will not be repeated.

Next, the cleaning step (S20) was performed. Specifically, the cleaning solution was manufactured by adding HF (hydrogen fluoride) as a pH adjusting agent to the DI water so that pH would be adjusted to be 2.4, and adding hydrogen peroxide water with a dilution ratio of 0.5% diluted with the DI water as an oxidizing agent. Then, in a cleaning bath supplying the cleaning solution, the above described InP substrate was cleaned for thirty seconds. Next, as a rinse step, the substrate was rinsed for twenty seconds with the DI water to which the ultrasonic wave was not being applied, and then the substrate was rotated at 3000 rpm to sputter the moisture for drying.

It should be understood that in Example 4, as a rinse step, another substrate was manufactured by rinsing the substrate with the DI water to which the ultrasonic wave was being applied.

Then, the post-treatment step (S30) was performed. Since the step (S30) was performed in a manner similar to that in Example 1, the description will not be repeated.

Manufacturing Sample in Example 5

First, the substrate preparation step (S10) was performed. Since the step (S10) was performed in a manner similar to that in Example 2, the description will not be repeated.

Next, the pre-cleaning step (S40) was performed. The step (S40) was performed in a manner similar to that in Example 2, the description will not be repeated.

Next, the cleaning step (S20) was performed. Specifically, the cleaning solution was manufactured by adding malic acid as a pH adjusting agent to the DI water so that pH would be 5.0, and adding hydrogen peroxide water having a dilution factor of 0.5% diluted with the DI water as an oxidizing agent. Then, in a cleaning bath supplying the cleaning solution, the above described InP substrate was cleaned for thirty seconds. Next, as a rinse step, the substrate was rinsed for twenty seconds with the DI water to which the ultrasonic wave was not being applied, and then the substrate was rotated at 3000 rpm to sputter the moisture for drying.

Finally, the post-treatment step (S30) was performed. Since the step (S30) was performed in a manner similar to that in Example 1, the description will not be repeated.

Manufacturing Sample in Comparative Example 1

First, the substrate preparation step (S10) was performed. Since the step (S10) was performed in a manner similar to that in Example 3, the description will not be repeated.

Next, the pre-cleaning step (S40) was performed. Since the step (S40) was performed in a manner similar to that in Example 3, the description will not repeated.

Next, the cleaning step (S20) was performed. Specifically, the cleaning solution was manufactured by adding sulfuric acid as a pH adjusting agent to DI water so that pH would be 1.0, and adding hydrogen peroxide water having a dilution ratio of 0.5% diluted with DI water as an oxidizing agent. In a cleaning bath supplying the cleaning solution, the above described InP substrate was cleaned for thirty seconds. Next, as a rinse step, the substrate was rinsed for twenty seconds with DI water to which the ultrasonic wave was not being applied, and then the substrate was rotated at 3000 rpm to sputter the moisture for drying.

Finally, the post-treatment step (S30) was performed. Since the step (S30) was performed in a manner similar to that in Example 1, the description will not be repeated.

Manufacturing Sample in Comparative Example 2

First, the substrate preparation step (S10) was performed. The step (S10) was performed in a manner similar to that in Example 1, the description will not be repeated.

Next, the pre-cleaning step (S40) was performed. Since the step (S40) was performed in a manner similar to that in Example 1, the description will not be repeated.

Next, the cleaning step (S20) was performed. Specifically, the cleaning solution was manufactured by adding hydrogen peroxide water having a dilution ratio of 0.5% diluted with DI water as an oxidizing agent to DI water having a pH of 6.4, without using a pH adjusting agent. Then, in a cleaning bath supplying the cleaning solution, the above described InP substrate was cleaned for thirty seconds.

Next, as a rinse step, the substrate was rinsed for twenty seconds with the DI water to which the ultrasonic wave was not being applied, and the substrate was rotated at 3000 rpm to sputter the moisture for drying.

Finally, the post-treatment step (S30) was performed. Since the step (S30) was performed in a manner similar to that in Example 1, the description will not be repeated.

Manufacturing Sample in Comparative Example 3

First, the substrate preparation step (S10) was performed. Since the step (S10) was performed in a manner similar to that in Example 2, the description will not be repeated.

Next, the pre-cleaning step (S40) was performed. Since the step (S40) was performed in a manner similar to that in Example 2, the description will not be repeated.

Next, the cleaning step (S20) was performed. Specifically, the cleaning solution was manufactured by adding ammonia as a pH adjusting agent to the DI water so that pH would be 9.5, and adding hydrogen peroxide water having a dilution ratio of 0.5% diluted with DI water as an oxidizing agent. Then, in a cleaning bath supplying the cleaning solution, the above described InP substrate was cleaned for thirty seconds. Next, as a rinse step, the substrate was rinsed for twenty seconds with the DI water to which the ultrasonic wave was not being applied, and then the substrate was rotated at 3000 rpm to sputter the moisture for drying.

Finally, the post-treatment step (S30) was performed. Since the step (S30) was performed in a manner similar to that in Example 1, the description will not be repeated.

Haze Measurement after Epitaxial Growth

Figure 4:
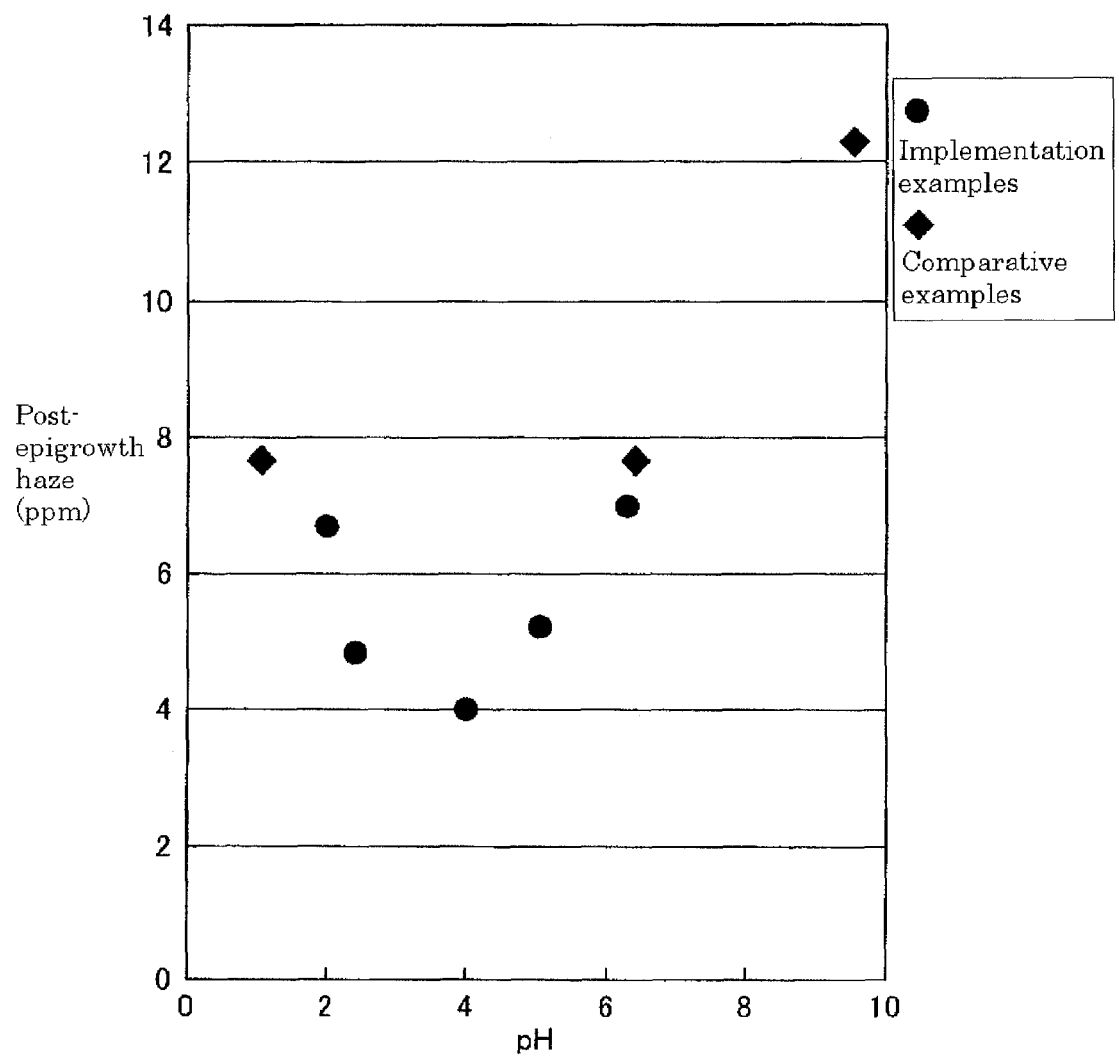
FIG. 4 is a graph showing a relationship between pH of the cleaning solution and haze following epitaxial growth.

Micro-roughness (haze) on the surface was measured for substrates in Implementation Examples 1 and 2, and Comparative Example 1 after the epitaxial growth. Surfscan 6220 of KLA Tencor was used to measure haze. The apparatus was set such that the range had 50 ppm at max and the edge exclusion was 2 mm. It should be noted that "haze" indicates a post-epigrowth haze average value (haze average). The results are shown in FIG. 4.

Measurement of Number of Particles

The number of particles was measured for the substrate in Example 4 in which the rinse step was performed to rinse the substrate with the DI water to which the ultrasonic wave was being applied, and the substrate in Example 4 in which the rinse step was performed to rinse the substrate with the DI water to which the ultrasonic wave was not being applied. Surfscan 6220 of KLA Tencor was used to measure the number of particles. The number of particles indicates the number of particles having a size of φ0.265 μm or more per a substrate having a diameter of 50 mm. The results are tabulated in the following table.

TABLE

| | Ultrasonic wave ON | Ultrasonic wave OFF |
|---|---|---|
| Average (number/50 mm dia.) | 0.9 | 2.0 |
| Standard deviation | 1.0 | 1.8 |
| No. of samplings | 20 | 20 |

Measurement Results

FIG. 4 is a graph showing a relationship between pH of the cleaning solution after the cleaning step (S20) and haze on the surface after the epitaxial growth. In FIG. 4, the vertical axis indicates haze (unit: ppm) on the surface of the substrate after the epitaxial growth, and the horizontal axis indicates pH of the cleaning solution (no unit of quantity).

As shown in FIG. 4, post-epigrowth haze exhibited in Implementation Examples 1 through 5 was 4 ppm, 6.7 ppm, 7.0 ppm, 4.8 ppm, and 5.2 ppm, respectively. In Implementation Examples 1 through 5, haze on the surface of the substrate was decreased by employing a surface treatment method in which pH of the cleaning solution was from 2 to 6.3 inclusive, which were in the scope of the present invention.

In contrast, in Comparative Examples 1 through 3, haze after the epitaxial growth showed 7.6 ppm, 7.6 ppm, and 12.3 ppm, respectively. In Comparative Examples 1 through 3, haze on the surface of the substrate was increased because the surface treatment method was employed in which pH of the cleaning solution were 1, 6.4, and 9.5, which were out of the scope of the present invention.

Furthermore, the table indicates results of the measurement of the number of particles on the substrates in Example 4, some of the substrates were rinsed with the DI water to which the ultrasonic wave was being applied in the substrate rinse step (ultrasonic wave ON), the other of the substrates were rinsed with the DI water to which the ultrasonic wave was not being applied (ultrasonic wave OFF). It should be noted that as the number of samplings (n count) twenty sites were measured.

As shown in the table, the number of particles on the substrate (ultrasonic wave ON) was 0.9 or less numbers per a substrate having a diameter of 50 mm, which was low. In the substrate (ultrasonic wave OFF), the number of particles was 0.9 or less number per a substrate having a diameter of 50 mm. It should be noted that in the cleaning step (S20) in Example 2, if the cleaning time was set to less than five seconds, actual cleaning times were varied enormously due to air intrusion into piping or the like. Therefore, by setting the cleaning time to be five seconds or more, the cleaning step (S20) was performed stably.

The presently disclosed Embodiments and Implementation Examples should in all respects be considered to be illustrative and not limiting. The scope of the present invention is set forth not by the foregoing description but by the scope of the patent claims, and is intended to include meanings equivalent to the scope of the patent claims and all modifications within the scope.

What is claimed is:

1. A method of surface treating a substrate, comprising:
   a step of preparing a substrate composed of a Group III-V semiconductor compound and containing 5 mass % or more of indium;
   a pre-cleaning step of cleaning the substrate using an alkaline cleaning solution; and
   a cleaning step of cleaning the substrate with a cleaning solution whose pH has been adjusted to an acidity of 2 to 6.3 inclusive and to which an oxidizing agent has been added in an amount in the range of from 5 ppm to 1 mass %.

2. A substrate surface treating method as set forth in claim 1, wherein the cleaning time is from 5 seconds to 60 seconds inclusive.

3. A substrate surface treating method as set forth in claim 1, wherein said pre-cleaning step includes a water-wash step of rinsing the substrate with DI water.

4. A substrate surface treating method as set forth in claim 1, wherein said cleaning step includes a rinsing step of rinsing the substrate with DI water.

5. A substrate surface treating method as set forth in claim 4, wherein the rinsing step includes applying ultrasonic waves to the DI water.

6. A substrate surface treating method as set forth in claim 1, wherein the alkaline cleaning solution used in said pre-cleaning step comprises one selected from the group consisting of: aqueous sodium hydroxide (NaOH), aqueous potassium hydroxide (KOH), aqueous ammonia, and a cleaning solution including amines.

7. A method of manufacturing a Group III-V compound semiconductor, comprising:
   implementing a substrate surface treating method as set forth in claim 1; and
   depositing a film on the surface of the substrate after implementing the substrate surface treating method.

* * * * *